United States Patent
Markham et al.

(10) Patent No.: US 11,807,955 B2
(45) Date of Patent: Nov. 7, 2023

(54) SYNTHETIC DIAMOND MATERIAL

(71) Applicant: ELEMENT SIX TECHNOLOGIES LIMITED, Didcot (GB)

(72) Inventors: Matthew Lee Markham, Didcot (GB); Andrew Mark Edmonds, Didcot (GB)

(73) Assignee: Element Six Technologies Limited, Didcot (GB)

( * ) Notice: Subject to any disclaimer, the term of this patent is extended or adjusted under 35 U.S.C. 154(b) by 478 days.

(21) Appl. No.: 16/962,860

(22) PCT Filed: Jan. 24, 2019

(86) PCT No.: PCT/EP2019/051724
§ 371 (c)(1),
(2) Date: Jul. 17, 2020

(87) PCT Pub. No.: WO2019/145407
PCT Pub. Date: Aug. 1, 2019

(65) Prior Publication Data
US 2020/0347515 A1   Nov. 5, 2020

(30) Foreign Application Priority Data
Jan. 26, 2018 (GB) ..................... 1801288

(51) Int. Cl.
*C30B 25/20* (2006.01)
*C30B 25/00* (2006.01)
(Continued)

(52) U.S. Cl.
CPC ........ *C30B 25/00* (2013.01); *B01L 3/502707* (2013.01); *C30B 25/04* (2013.01);
(Continued)

(58) Field of Classification Search
None
See application file for complete search history.

(56) References Cited

U.S. PATENT DOCUMENTS

| | | | |
|---|---|---|---|
| 2014/0035584 A1* | 2/2014 | Twitchen | G01R 33/302 324/321 |
| 2014/0037932 A1* | 2/2014 | Twitchen | C30B 25/02 423/446 |
| 2016/0334474 A1 | 11/2016 | Hatano et al. | |

FOREIGN PATENT DOCUMENTS

| | | |
|---|---|---|
| EP | 3211658 B1 | 12/2020 |
| GB | 2483767 A | 3/2012 |

(Continued)

OTHER PUBLICATIONS

Google translation JP5735172; Mar. 2023.*
(Continued)

*Primary Examiner* — Guinever S Gregorio
(74) *Attorney, Agent, or Firm* — Kilpatrick Townsend & Stockton LLP

(57) ABSTRACT

A synthetic diamond material comprises a surface, wherein the surface comprises a first surface region comprising a first concentration of quantum spin defects. A second surface region has a predetermined area and is located adjacent to the first surface region, the second region comprising a second concentration of quantum spin defects. The first concentration of quantum spin defects is at least ten times greater than the second concentration of quantum spin defects, and at least one of the first or second surface regions comprises chemical vapour deposition, CVD, synthetic diamond. A method of producing the synthetic diamond material is also disclosed.

15 Claims, 7 Drawing Sheets

(51) Int. Cl.
B01L 3/00 (2006.01)
C30B 25/04 (2006.01)
C30B 29/04 (2006.01)
G01N 24/10 (2006.01)
G01R 33/30 (2006.01)
G01R 33/60 (2006.01)
B82Y 10/00 (2011.01)

(52) U.S. Cl.
CPC ............ C30B 29/04 (2013.01); G01N 24/10 (2013.01); G01R 33/302 (2013.01); G01R 33/60 (2013.01); B01L 2300/0627 (2013.01); B82Y 10/00 (2013.01)

(56) References Cited

FOREIGN PATENT DOCUMENTS

| | | | | |
|---|---|---|---|---|
| JP | 5735172 B2 * | 6/2015 | ............ | C30B 25/02 |
| WO | 20100010344 A1 | 1/2010 | | |
| WO | 20100010352 A1 | 1/2010 | | |
| WO | 20100149775 A1 | 12/2010 | | |
| WO | 20120034924 A1 | 3/2012 | | |

OTHER PUBLICATIONS

Feng et al., "Efficient generation of nanoscale arrays of nitrogen-vacancy centers with long coherence time in diamond," Applied Physics A Materials Science & Processing, Oct. 11, 2016, pp. 1-7, vol. 122, Springer-Verlag Berlin Heidelberg.

Naydenov et al., "Enhanced generation of single optically active spins in diamond by ion implantation," Applied Physics Letters, 2010, pp. 163108-1-163108-3, vol. 96, American Institute of Physics.

Staudacher et al., "Enhancing the spin properties of shallow implanted nitrogen vacancy centers in diamond by epitaxial overgrowth," Applied Physics Letters, 2012, pp. 212401-1-212401-4, vol. 101, American Institute of Physics.

Watanabe et al., "Formation of Nitrogen-Vacancy Centers in Homoepitaxial Diamond Thin Films Grown via Microwave Plasma-Assisted Chemical Vapor Deposition," IEEE Transactions on Nanotechnology, Jul. 2016, pp. 614-618, vol. 15, No. 4, Institute of Electrical and Electronics Engineers.

Gomi et al., "Position and Density Control of Nitrogen-vacancy Centers in Diamond Using Micropatterned Substrate for Chemical Vapor Deposition," 2013 Conference on Laser and Electro-Optics Pacific Rim (CLEO-PR), Jun. 30-Jul. 4, 2013, Kyoto, Japan, Institute of Electrical and Electronics Engineers.

Schukraft et al., "Invited Article: Precision nanoimplantation of nitrogen vacancy centers into diamond photonic crystal cavities and waveguides," APL Photonics, May 23, 2016, pp. 020801-1-020801-9, vol. 1, No. 2, American Institute of Physics.

Acosta et al., "High nitrogen-vacancy density diamonds for magnetometry application," Phys. Rev. B, Sep. 2009, pp. 115202 et seq, vol. 80, No. 11, American Physical Society.

United Kingdom Patent Application No. GB1801288.0, Combined Search and Examination Report dated Jun. 22, 2018, 8 pages.

United Kingdom Patent Application No. GB1900968.7, Combined Search and Examination Report dated Mar. 22, 2019, 9 pages.

International Patent Application No. PCT/EP2019/051724, International Search Report and Written Opinion dated May 3, 2019, 14 pages.

* cited by examiner

SYNTHETIC DIAMOND MATERIAL

FIELD OF THE INVENTION

The invention relates to the field of synthetic diamond material and methods of fabricating synthetic diamond material.

BACKGROUND

Point defects in synthetic diamond material, particularly quantum spin defects and/or optically active defects, have been proposed for use in various sensing, detecting, and quantum processing applications including: magnetometers; spin resonance devices such as nuclear magnetic resonance (NMR) and electron spin resonance (ESR) devices; spin resonance imaging devices for magnetic resonance imaging (MRI); and quantum information processing devices such as for quantum computing.

Many point defects have been studied in synthetic diamond material including: silicon containing defects such as silicon-vacancy defects (Si-V), silicon di-vacancy defects (Si-$V_2$), silicon-vacancy-hydrogen defects (Si-V:H), silicon di-vacancy hydrogen defects (S-$V_2$:H); nickel containing defect; chromium containing defects; and nitrogen containing defects such as nitrogen-vacancy defects (N-V), di-nitrogen vacancy defects (N-V-N), and nitrogen-vacancy-hydrogen defects (N-V-H). These defects are typically found in a neutral charge state or in a negative charge state. It will be noted that these point defects extend over more than one crystal lattice point. The term point defect as used herein is intended to encompass such defects but not include larger cluster defects, such as those extending over ten or more lattice points, or extended defects such as dislocations which may extend over many lattice points.

It has been found that certain defects are particularly useful for sensing, detecting, and quantum processing applications when in their negative charge state. For example, the negatively charged nitrogen-vacancy defect ($NV^-$) in synthetic diamond material has attracted a lot of interest as a useful quantum spin defect because it has several desirable features including:

(i) Its electron spin states can be coherently manipulated with high fidelity owing to an long coherence time at room temperature (which may be quantified and compared using the transverse relaxation time $T_2$ and/or $T_2^*$);

(ii) Its electronic structure allows the defect to be optically pumped into its electronic ground state allowing such defects to be placed into a specific electronic spin state even at non-cryogenic temperatures. This can negate the requirement for expensive and bulky cryogenic cooling apparatus for certain applications where miniaturization is desired. Furthermore, the defect can function as a source of photons which all have the same spin state; and (iii) Its electronic structure comprises emissive and non-emissive electron spin states which allows the electron spin state of the defect to be read out through photons. This is convenient for reading out information from synthetic diamond material used in sensing applications such as magnetometry, spin resonance spectroscopy and imaging. Furthermore, it is a key ingredient towards using the $NV^-$ defects as qubits for long-distance quantum communications and scalable quantum computation. Such results make the $NV^-$ defect a competitive candidate for solid-state quantum information processing (QIP).

The $NV^-$ defect in diamond consists of a substitutional nitrogen atom adjacent to a carbon vacancy. Its two unpaired electrons form a spin triplet in the electronic ground state ($^3A$), the degenerate ms=±1 sublevels being separated from the $m_s$=0 level by 2.87 GHz. The $m_s$=0 sublevel exhibits a high fluorescence rate when optically pumped. In contrast, when the defect is excited in the $m_s$=±1 levels, it exhibits a higher probability to cross over to the non-radiative singlet state ($^1A$) followed by a subsequent relaxation into $m_s$=0. As a result, the spin state can be optically read out, the ms=0 state being "bright" and the $m_s$=±1 states being dark. When an external magnetic field is applied, the degeneracy of the spin sublevels $m_s$=±1 is broken via Zeeman splitting. This causes the resonance lines to split depending on the applied magnetic field magnitude and its direction. In the case of all four possible NV alignments being present in the excitation and detection region of a sample, this dependency can be used for vector magnetometry as the resonant spin transitions can be probed by sweeping the microwave (MW) frequency resulting in characteristic dips in the optically detected magnetic resonance (ODMR) spectrum.

$NV^-$ defects in synthetic diamond material can be formed in a number of different ways including:

(i) formation during growth of the synthetic diamond material where a nitrogen atom and a vacancy are incorporated into the crystal lattice as a nitrogen-vacancy pair during growth;

(ii) formation after diamond material synthesis from native nitrogen and vacancy defects incorporated during the growth process by post-growth annealing the material at a temperature (around 800° C.) which causes migration of the vacancy defects through the crystal lattice to pair up with native single substitutional nitrogen defects;

(iii) formation after diamond material synthesis from native nitrogen defects incorporated during the growth process by irradiating the synthetic diamond material with electrons or neutrons to introduce vacancy defects and then subsequently annealing the material at a temperature which causes migration of the vacancy defects through the crystal lattice to pair up with native single substitutional nitrogen defects;

(iv) formation after diamond material synthesis by implanting nitrogen defects into the synthetic diamond material after diamond material synthesis and then annealing the material at a temperature which causes migration of the native vacancy defects through the crystal lattice to pair up with implanted single substitutional nitrogen defects; and (v) formation after diamond material synthesis by irradiating the synthetic diamond material to introduce vacancy defects, implanting nitrogen defects into the synthetic diamond material before or after irradiation, and annealing the material at a temperature which causes migration of the vacancy defects through the crystal lattice to pair up with implanted single substitutional nitrogen defects.

Various different types of diamond material have been disclosed in the prior art for use in various different types of magnetometry applications including:

Acosta et al., Phys. Rev. B 80, 115202 which discusses the properties of high pressure high temperature (HPHT) diamond materials for magnetometry applications;

WO2010/010352 and WO2010/010344 which disclose low nitrogen content single crystal chemical vapour deposited (CVD) diamond materials for applications such as magnetometry; and WO2010/149775 which discloses irradiated and annealed single crystal CVD diamond materials for applications such as magnetometry.

SUMMARY

While various types of diamond material have been proposed for magnetometry applications, it is an aim of embodiments of the present invention to optimize a diamond material for new sensing applications.

According to a first aspect, there is provided a synthetic diamond material comprising a surface, wherein the surface comprises a first surface region comprising a first concentration of quantum spin defects. A second surface region has a predetermined area and is located adjacent to the first surface region, the second region comprising a second concentration of quantum spin defects. The first concentration of quantum spin defects is at least ten times greater than the second concentration of quantum spin defects, and at least one of the first or second surface regions comprises chemical vapour deposition, CVD, synthetic diamond.

Different types of quantum spin defects can be engineered into synthetic diamond material. Examples of quantum spin defects in diamond include defects containing any of any silicon, nickel, chromium, germanium, tin and nitrogen. Some of these may be negatively charged, neutral or positively charged.

As an option, the quantum spin defects are negatively charged nitrogen-vacancy defects $NV^-$.

The first concentration of quantum spin defects is optionally at least one hundred times greater than the second concentration of quantum spin defects.

The invention can be applied to any type of surface, including a substantially planar surface.

The first concentration of quantum spin defects is optionally equal to or greater than: $1\times10^{13}$ defects/cm$^3$; $1\times10^{14}$ defects/cm$^3$; $1\times10^{15}$ defects/cm$^3$; $1\times10^{16}$ defects/cm$^3$; $1\times10^{17}$ defects/cm$^3$; $1\times10^{18}$ defects/cm$^3$.

The concentration of quantum spin defects in the first surface region is optionally equal to or less than: $4\times10^{18}$ defects/cm$^3$; $2\times10^{18}$ defects/cm$^3$; $1\times10^{18}$ defects/cm$^3$; $1\times10^{17}$ defects/cm$^3$; or $1\times10^{16}$ defects/cm$^3$.

As an option, the quantum spin defects have a Hahn-echo decoherence time $T_2$ equal to or greater than 0.01 ms, 0.05 ms, 0.1 ms, 0.3 ms, 0.6 ms, 1 ms, 5 ms, or 15 ms.

The synthetic diamond material optionally comprises a plurality of first surface regions.

A depth of the first region below the planar front surface is optionally between 100 nm and 100 µm.

As a further option, the surface further comprises a third surface region, the third surface region comprising boron. Boron doping makes diamond electrically conductive, and so this can be used to apply an electrical field in proximity to the first surface region.

As an option, the second surface region surrounds the first surface region.

According to a second aspect, there is provided a method of fabricating a synthetic diamond material as described above in the first aspect. The method comprises providing a synthetic diamond substrate having a front surface. A CVD process is used to grow further diamond material over the front surface of the single crystal diamond substrate. The front surface of the synthetic diamond substrate is then processed to form a sensing surface having a first surface region of further diamond material adjacent to a second surface region of diamond substrate material, wherein a quantum spin defect concentration of the further diamond material is at least ten times greater than a quantum spin defect of the synthetic diamond substrate material.

As an option, the method comprises forming at least one depression in the front surface of the diamond substrate, growing the further diamond material in the depression, and processing back the further diamond material over the front surface of the synthetic diamond substrate to form the sensing surface. The depression is optionally formed by any of etching, masked etching, grinding, and polishing, and has a depth of between 100 nm and 100 µm.

As an alternative option, the method comprises locating a mask having at least one opening over the front surface and growing the further diamond material over the mask such that further diamond material is grown in a selected area over the front surface. The mask is then removed, and second further diamond material is grown over the front surface. The second further diamond material is then processed to form the sensing surface.

As an option, the quantum spin defects comprise any of silicon, nickel, chromium, germanium, tin and nitrogen.

As a further option, the quantum spin defects are negatively charged nitrogen-vacancy defects, $NV^-$.

The processing optionally comprises any of irradiation and annealing. This is used, for example, to convert nitrogen in the diamond into $NV^-$ centres.

According to a third aspect, there is provided a microfluidic cell comprising a microfluidic channel for receiving a fluid sample, a sensor located adjacent the microfluidic channel, and wherein the sensor comprises the synthetic diamond material as described above in the first aspect.

According to a fourth aspect, there is provided a magnetometry sensing probe comprising the synthetic diamond material as described above in the first aspect.

BRIEF DESCRIPTION OF THE DRAWINGS

Non-limiting example arrangements to illustrate the present disclosure are described hereafter with reference to the accompanying drawings, of which.

DETAILED DESCRIPTION

As described above, known diamond materials with high numbers of quantum spin defects can be used as sensors. However, more sensor functionality and resolution could be achieved by forming a diamond material with predetermined regions of a diamond material having a higher concentration of quantum spin defects than the surrounding regions. These regions of high concentration quantum spin defects can be formed in patterns as required. The inventors have developed techniques for forming such regions.

The following description refers to high concentrations of NV– defects by way of example, but it will be appreciated that the same or similar techniques can be used for forming other types of quantum spin defects, such as silicon containing defects, nickel containing defects, chromium containing defects, germanium containing defects, tin containing defects and nitrogen containing defects.

Figure 1:
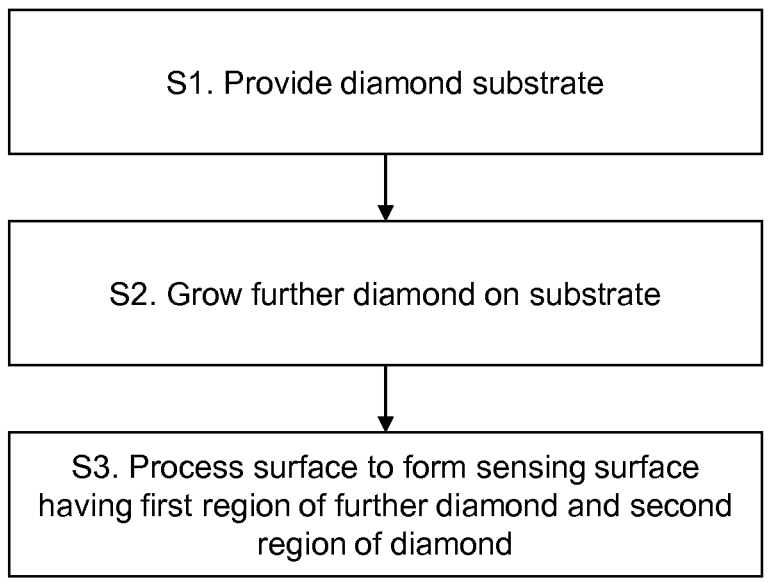
FIG. 1 is a flow diagram showing steps for fabricating a synthetic diamond material.

FIG. 1 is a flow diagram showing exemplary steps for forming a diamond material that has regions containing at least ten times the concentration of $NV^-$ defects than the surrounding regions. The following numbering corresponds to that of FIG. 1:

S1. A synthetic diamond substrate is provided. This may be CVD, HPHT, or another form of synthetic diamond.

S2. Further diamond is grown using a CVD on a front surface of the substrate.

S3. The surface is then processed to form a first surface region of diamond having a first quantum spin defect concentration, and a second surface region adjacent to the first surface region, the second surface region having a second quantum spin defect concentration, wherein the first quantum spin defect concentration is at least ten times greater than the second concentration of quantum spin defects. This further processing may also include irradiation and annealing steps.

Figure 2:
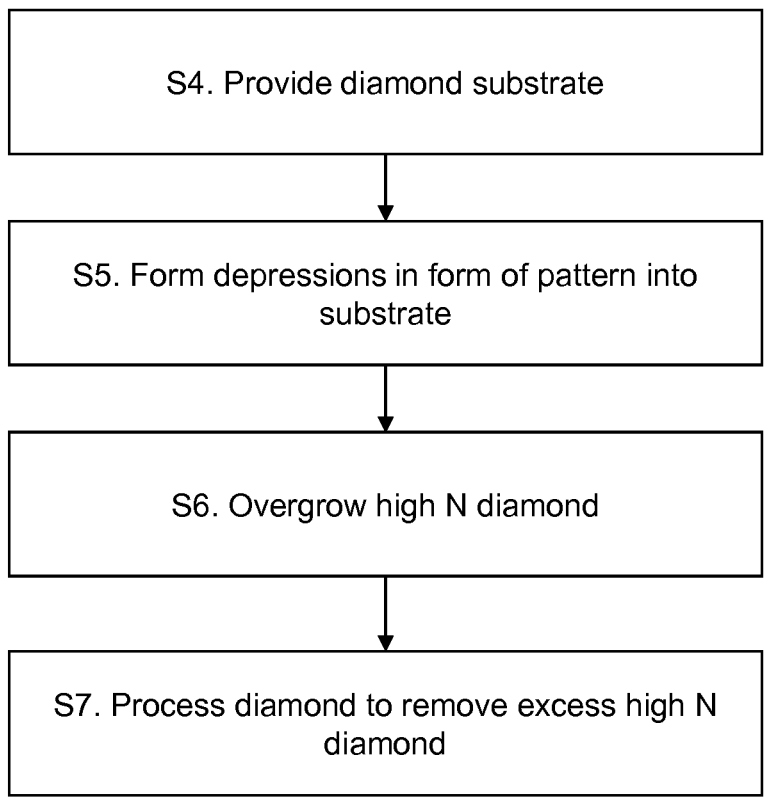
FIG. 2 is a flow diagram showing steps for fabricating a synthetic diamond material according to a first exemplary embodiment.

FIG. 2 is a flow diagram showing exemplary steps for a first exemplary embodiment. The following numbering corresponds to that of FIG. 2:

S4. A synthetic diamond substrate is provided. This may be CVD, HPHT, or another form of synthetic diamond.

Figure 3:
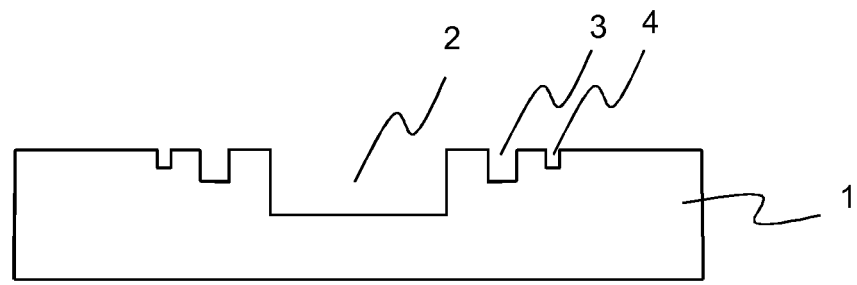
FIG. 3 illustrates schematically a side elevation cross-section view of an etched diamond substrate.
Figure 4:
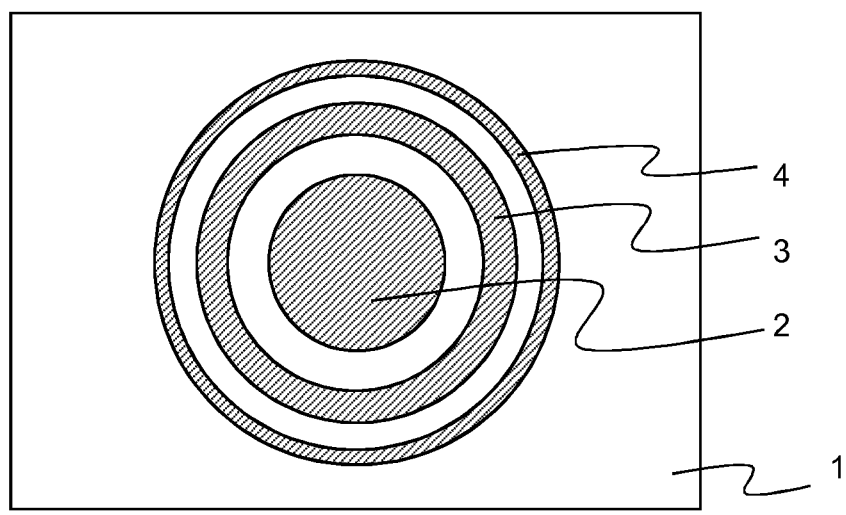
FIG. 4 illustrates schematically a plan view of the etched diamond substrate of FIG. 4.

S5. A pattern of depressions is formed in a planar front surface of the synthetic diamond substrate. Exemplary ways of forming such depressions include etching using a mask, grinding selected areas, polishing selected areas and so on. FIG. 3 is a schematic side elevation cross-section view of an exemplary synthetic diamond substrate 1, and FIG. 4 is a schematic plan view of the same diamond substrate 1. A circle 2 and two concentric rings 3, 4 have been etched into the surface 5 of the synthetic diamond substrate 1 to different depths using masked etching. The depth of the depression may vary between around 100 nm and 100 μm. The depressions shown in FIG. 3 have 90° corners when viewed in cross-section. It will be appreciated that other shapes such as curved corners, chamfered corners, or V-shaped depressions may be used as these may give improved overgrowth of further diamond in the following step S6.

Figure 5:
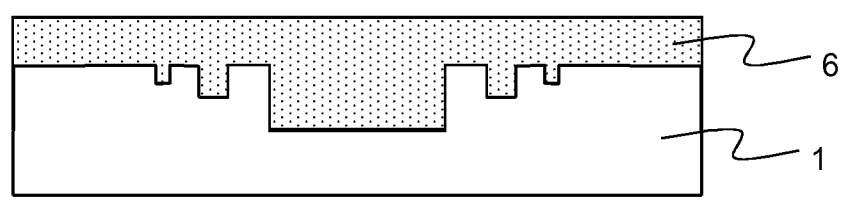
FIG. 5 illustrates schematically a side elevation cross-section view of a further diamond material grown on the diamond substrate.

S6. Using a CVD process, a further diamond material is grown onto the planar front surface 5 of the synthetic diamond material. The further diamond material is grown under conditions to provide a concentration of $NV^-$ defects at least ten times higher than that the concentration of NV- defects in the synthetic diamond substrate. FIG. 5 illustrates schematically a side elevation cross section view of the synthetic diamond substrate of FIGS. 3 and 4 after overgrown of the further diamond material 6 onto the synthetic diamond substrate 1. Further diamond material 6 has grown in the depressions 2, 3, 4 in the synthetic diamond substrate 1 and also in a layer on the planar front surface 5 of the synthetic diamond material 1.

Figure 6:
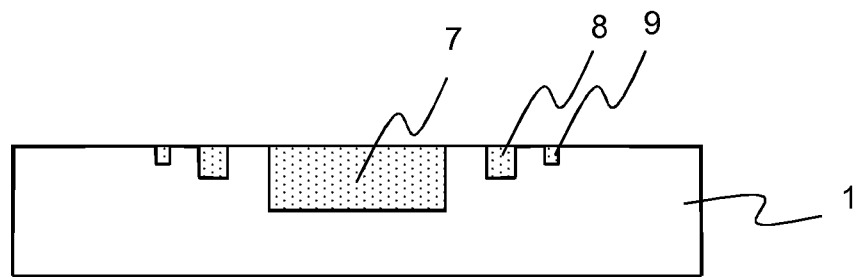
FIG. 6 illustrates schematically a side elevation cross-section view of a further diamond material grown on the diamond substrate after processing.
Figure 7:
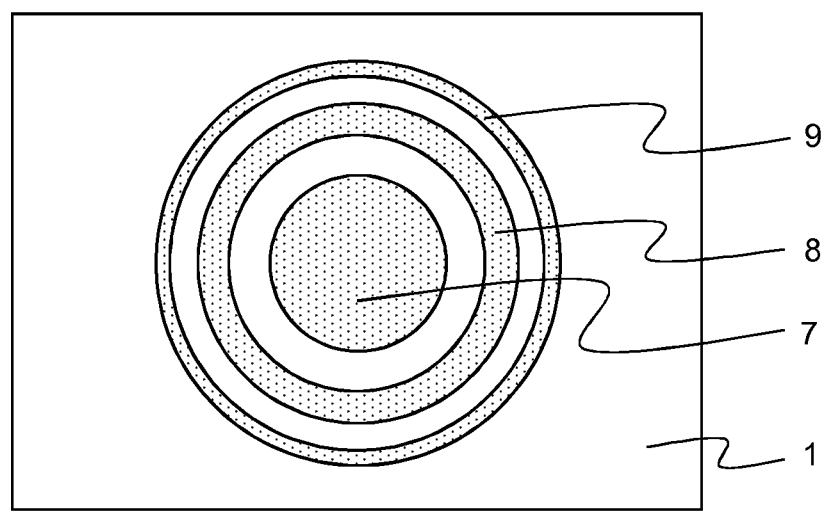
FIG. 7 illustrates schematically a plan view of the diamond material of FIG. 6 after processing.

S7. The resultant composite diamond material is processed back to remove excess further diamond material 6. Processing may be performed using standard techniques, such as polishing, grinding, mechanical polishing and etching. FIG. 6 illustrates schematically a side elevation cross section view of the diamond substrate 1 after the further diamond has been processed back. FIG. 7 illustrates schematically in plan view the same material as FIG. 6. The surface 10 of the diamond substrate 1 has a circle 7 of further diamond material surrounded by two concentric rings 8, 9 of further diamond material. The regions of further diamond material have an $NV^-$ concentration of at least ten times higher than that of the surrounding synthetic diamond substrate 1.

Using the techniques described above, a diamond material can be produced that has regions of high concentration of quantum spin defects surrounded by regions of lower concentration of quantum spin defects. Such materials can be used in sensing applications such as wide field imaging based on magnetic field sensing.

Example 1

A single crystal diamond substrate was provided with dimensions of 3×3×0.5 mm and a nitrogen concentration of 1.5 ppb. A mask was placed over a growth surface of substrate and the growth surface was selectively etched using inductively coupled plasma etching. This was performed using Ar and Cl feed gases, although it will be appreciated that oxygen could be used. The etching formed a depression pattern in the growth surface of the substrate. The skilled person will appreciate that other methods could be used to form 10 μm depressions, for example, grinding, machining, chemical-mechanical polishing and so on.

The etched diamond substrate was then placed in a vacuum chamber and a surface cleaning etch was performed using a hydrogen plasma.

The etched diamond substrate was placed in a CVD reactor chamber and further diamond was grown on the substrate to a thickness greater than the depth of the etched depression pattern. The further diamond was grown using the following conditions:
Microwave power=5 kW
Pressure=230 Torr
Hydrogen Flow Rate=600 sccm
Methane Flow Rate=30 sccm
Nitrogen dopant=60 sccm of 1000 ppm $N_2$ in $H_2$ The level of nitrogen doping was selected to be relatively high to ensure that the further diamond was grown with a much higher $NV^-$ concentration than that of the diamond substrate.

The further diamond was then polished back using mechanical polishing to remove a surface layer of the further diamond, to leave a structure similar to that shown in FIGS. 4 and 5, in which at the surface of the diamond material, there were regions of high nitrogen diamond 7, 8, 9 and low nitrogen diamond 1.

Parameters such as the nitrogen level can be varied according to the desired nitrogen concentration in the final product. Optionally, oxygen, CO or $CO_2$ can also be added to the growth process. After growth, the single crystal diamond material was treated using an irradiation and annealing process. This involved irradiating the material for six hours under an electron flux of $3\times10^{14}$ $cm^{-2}$ $s^{-1}$ and annealing at 400° C. for 4 hours, 800° C. for 16 hours and then 1200° C. for 2 hours. This process converts nitrogen in the diamond into $NV^-$ centres, making them useful as quantum spin defects.

Example 2

Figure 8:
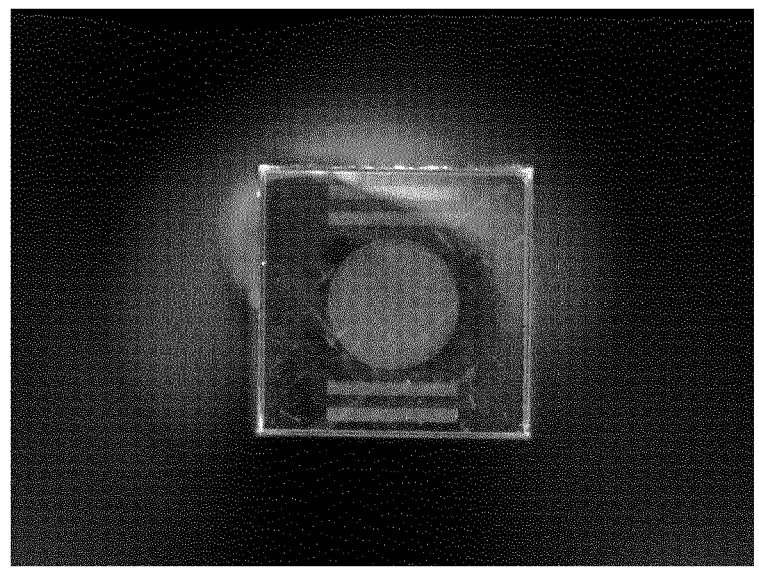
FIG. 8 is a UV illuminated photograph showing an exemplary diamond material.

FIG. 8 is a photograph of a synthetic diamond material made in the same way as that described above in FIG. 1, but using a different pattern of regions of higher concentrations of $NV^-$ defects. As the material is optically pumped using UV excitation, the regions containing a higher concentration of $NV^-$ defects fluoresce.

Example 3

Figure 9:
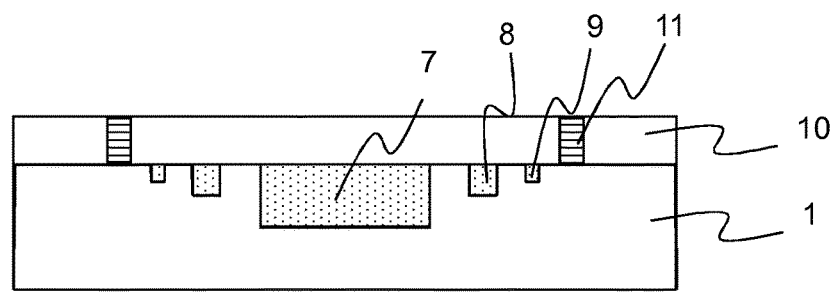
FIG. 9 is a side elevation view of a further exemplary embodiment in which a third diamond layer is provided.
Figure 10:
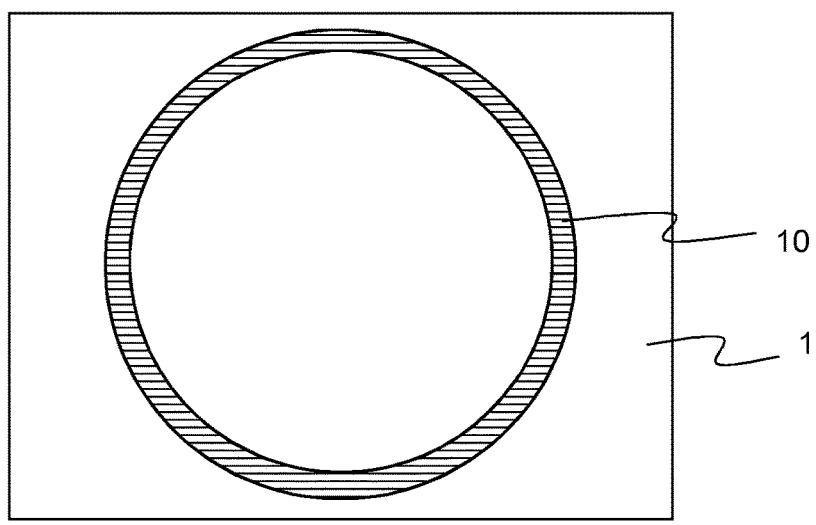
FIG. 10 illustrates schematically a plan view of the diamond material of FIG. 9.

As a further exemplary embodiment, further layers can be deposited onto the diamond material. Referring to FIGS. 9 and 10, the diamond material of FIGS. 6 and 7 has been further processed.

A third diamond layer 10 having a low nitrogen content (1.5 ppb) was grown onto the surface 11 of the synthetic diamond substrate material 1.

A mask was placed over the surface of the third diamond layer 10 and the surface was selectively etched using inductively coupled plasma etching. This was performed using Ar and Cl feed gases, although it will be appreciated that oxygen could be used. The etching formed a depression pattern in the growth surface of the substrate. The skilled person will appreciate that other methods could be used to form depressions, for example, grinding, machining, chemical-mechanical polishing and so on.

The etched third diamond layer 10 was then cleaned in a hydrogen plasma as described in Example 1.

The etched third diamond layer was then placed in a CVD reactor chamber and additional diamond was grown on the substrate to a thickness greater than the depth of the etched depression pattern. The additional diamond was grown using the following conditions:
Microwave power=3.6 kW
Pressure=140 Torr
Hydrogen Flow Rate=600 sccm
Methane Flow Rate=32 sccm
$B_2H_6$ Flow Rate=19 sccm The addition of boron was to ensure that the additional diamond had a boron content sufficient to form an electrically conductive synthetic diamond.

The additional diamond was then polished back using mechanical polishing to remove a surface layer of the additional diamond, to leave a structure similar to that shown in FIGS. 8 and 9. The surface of the third diamond layer 10 contains a region of boron doped diamond 11 in the form of a ring. This region 11 is conductive, and so can be used to apply an electric field in proximity to the regions of further diamond 7, 8, 9 that have a high concentration of quantum spin defects. The conductive region 11 may also be used as a way of generating microwaves.

Example 4

Figure 11:
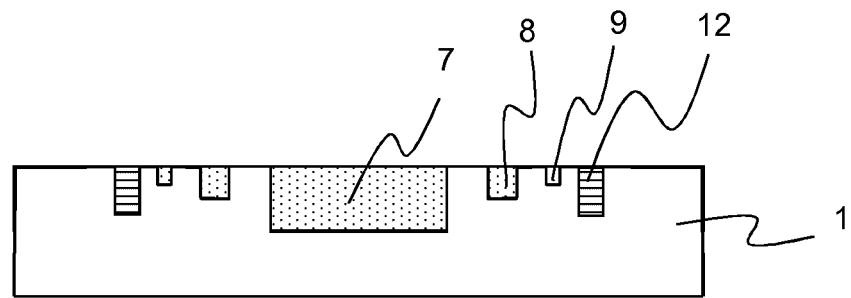
FIG. 11 is a side elevation view of a still further exemplary embodiment.
Figure 12:
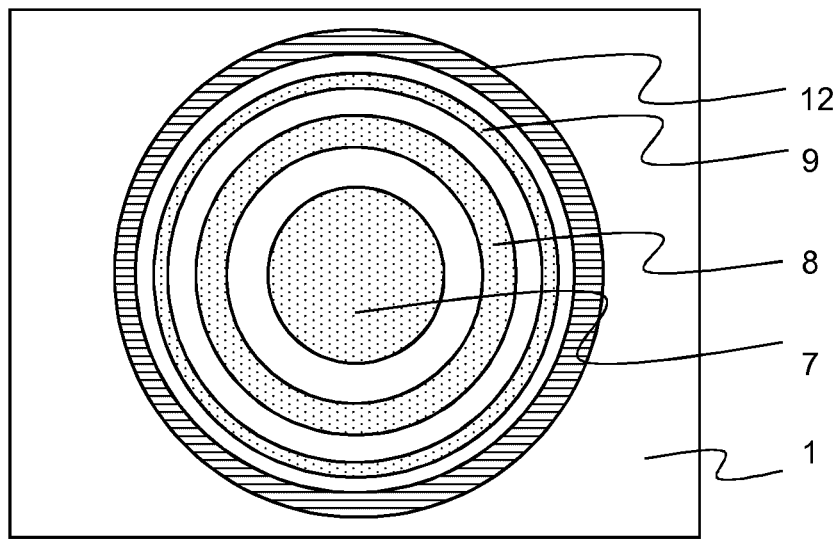
FIG. 12 illustrates schematically a plan view of the diamond material of FIG. 11.

As an alternative to Example 3, the boron-doped third diamond layer can be disposed in the same plane as the further diamond of Example 1. This is shown in FIGS. 11 and 12. In this instance, a material is made in the same way as described above in example 1. A mask is then placed over the surface of the diamond material, and a pattern is etched into the surface. The mask is removed, leaving a surface with an etched depression. A third diamond material is then overgrown on the surface and into the depression. The third diamond material in this example is doped with boron. The new surface was then polished back to leave a structure as shown in FIGS. 11 and 12.

The resultant surface comprises surface regions 7, 8, 9 having a high concentration of quantum spin defects, and a surface region 12 having boron doped diamond.

Figure 13:
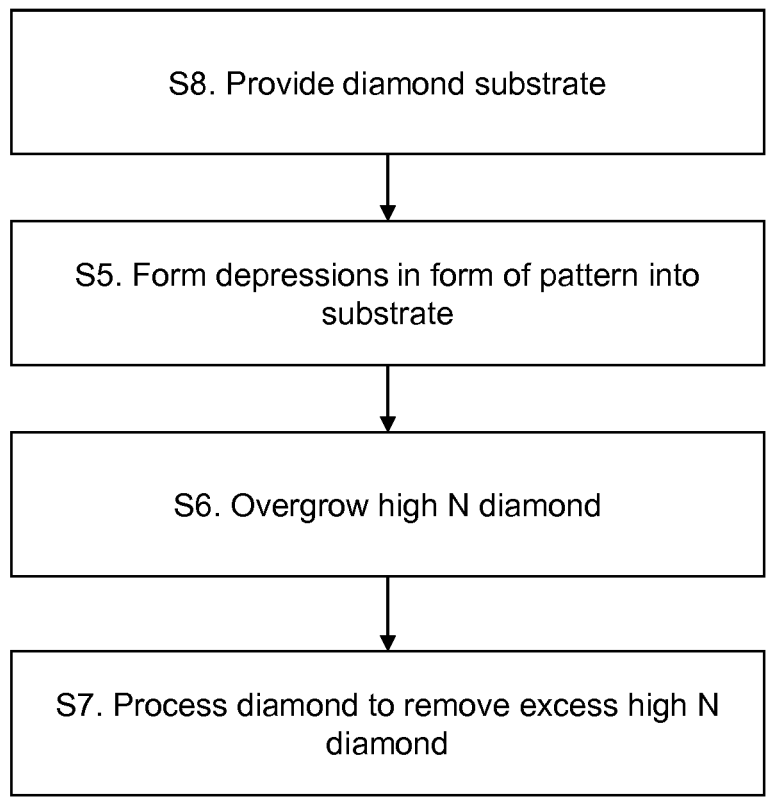
FIG. 13 is a flow diagram showing steps for fabricating a synthetic diamond material according to a further exemplary embodiment.

The above embodiments and examples describe one way to obtain a synthetic diamond material with a surface comprising a first surface region comprising a first concentration of quantum spin defects and a second surface region having a predetermined area and located adjacent to the first surface region. An alternative technique is shown in FIG. 13. The following numbering corresponds to that of FIG. 13:

S8. A synthetic diamond substrate 13 is provided. This may be CVD, HPHT, or another form of synthetic diamond.

Figure 14:
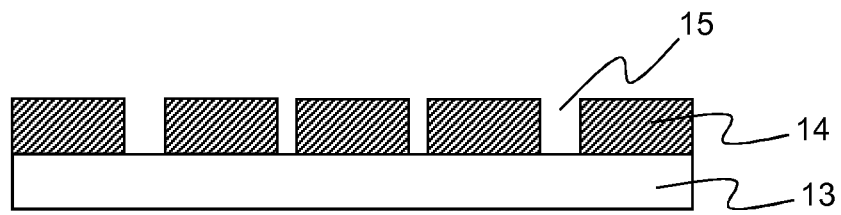
FIG. 14 illustrates schematically a side elevation cross-section view of a diamond substrate and a mask.

S9. Referring to FIG. 14, a mask 14 having at least one opening 15 is located over a surface of 1 synthetic diamond substrate 13.

Figure 15:
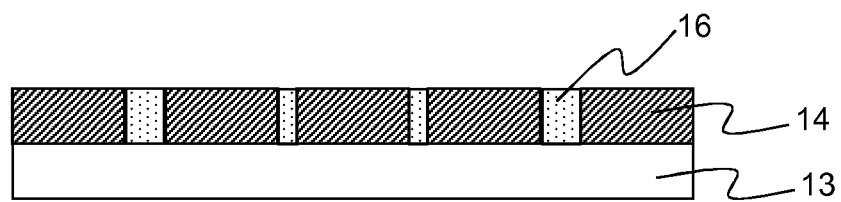
FIG. 15 illustrates schematically a side elevation cross-section view of the diamond substrate and mask of FIG. 14, with further diamond material grown in openings in the mask.

S10. Further diamond material 16 is grown over the mask 14 and fills the openings of the mask 14, as shown in FIG. 15. The further diamond material has a higher nitrogen concentration than the synthetic diamond substrate 13.

Figure 16:
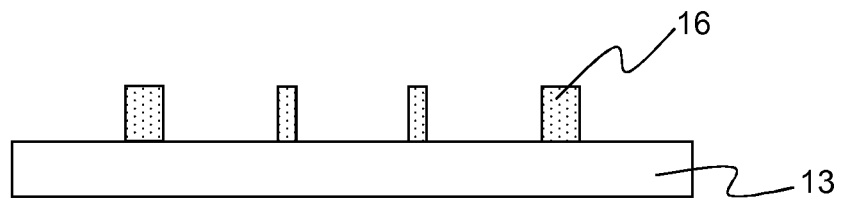
FIG. 16 illustrates schematically a side elevation cross-section view of the diamond substrate of FIG. 15, with the mask removed.

S11. The mask 14 is removed, to leave a synthetic diamond substrate with protruding growths of further diamond 16, as shown in FIG. 16.

Figure 17:
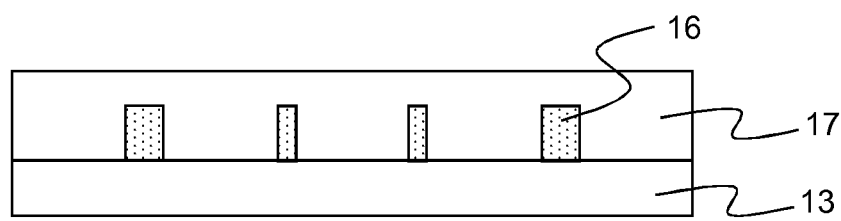
FIG. 17 illustrates schematically a side elevation cross-section view of the diamond substrate of FIG. 16, with further diamond material grown on the surface.

S12. Diamond material 16 (in this example corresponding to the diamond material of the synthetic diamond substrate 13) is then grown onto the diamond substrate 13, as shown in FIG. 17.

Figure 18:
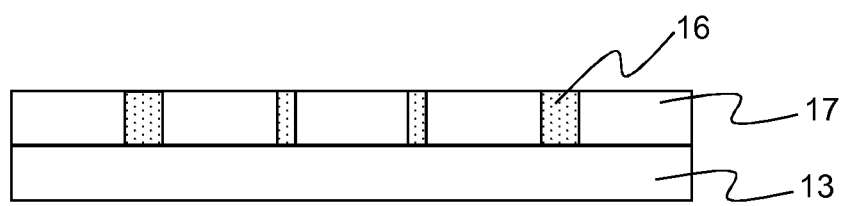
FIG. 18 illustrates schematically a side elevation cross-section view of the diamond substrate of FIG. 17 after processing.

S13. The new surface of the diamond material 16 is processed back using any suitable means to form a structure as shown in FIG. 18, in which the surface comprises regions 15 of diamond material containing a higher nitrogen content adjacent regions 16 of diamond material with a lower nitrogen content. Subsequent irradiation and annealing may be used to transform nitrogen in the diamond material to NV⁻ centres.

Using the techniques described above, a diamond material can be produced that has regions of high concentration of quantum spin defects surrounded by regions of lower concentration of quantum spin defects. Such materials can be used as sensing probes in sensing applications such as wide field imaging based on magnetic field sensing.

Figure 19:
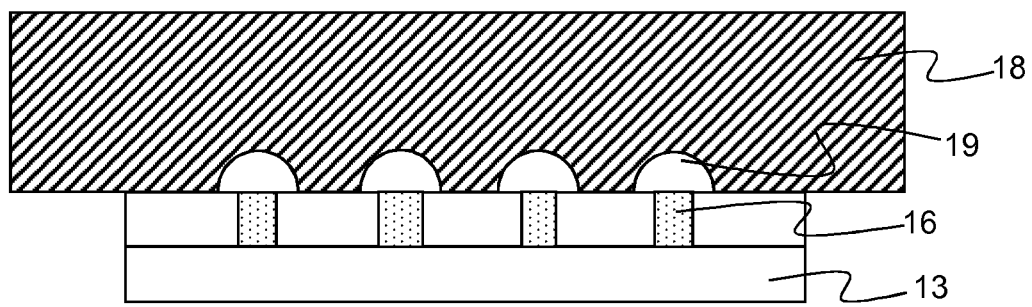
FIG. 19 illustrates schematically a side elevation cross-section view of a microfluidic cell.

Another exemplary use for the synthetic diamond material is in microfluidic sensing. FIG. 19 illustrates schematically an exemplary microfluidic cell 17 comprising diamond material 13 with regions 16 of diamond having a high concentration of quantum spin defects. The microfluidic cell comprises channels 18 adjacent to regions 16 of diamond having a high concentration of quantum spin defects, and can be used to analyse fluids. A discussion and description of microfluidic sensing using quantum spin defects in diamond may be found in WO 2012/034924.

The invention as set out in the appended claims has been shown and described with reference to embodiments. However, it will be understood by those skilled in the art that various changes in form and detail may be made without departing from the scope of the invention as defined by the appended claims.

The invention claimed is:

1. A synthetic diamond material comprising:
 a surface, wherein the surface comprises:
 a first surface region comprising a first concentration of quantum spin defects;
 a second surface region having a predetermined area and located adjacent to the first surface region, the second region comprising a second concentration of quantum spin defects, wherein the first concentration of quantum spin defects is at least ten times greater than the second concentration of quantum spin defects;
 wherein a depth of the first region below the planar front surface is between 100 nm and 100 μm; and
 wherein at least one of the first or second surface regions comprises chemical vapour deposition, CVD, synthetic diamond.

2. The synthetic diamond material according to claim 1, wherein the quantum spin defects are selected from any of:
 negatively charged nitrogen-vacancy defects NV⁻;
 silicon containing defects;
 nickel containing defects;
 chromium containing defects;
 germanium containing defects;
 tin containing defects; and
 nitrogen containing defects.

3. The synthetic diamond material according to claim 1, wherein the first concentration of quantum spin defects is at least one hundred times greater than the second concentration of quantum spin defects.

4. The synthetic diamond material according to claim 1 wherein the first concentration of quantum spin defects is equal to or greater than: $1 \times 10^{13}$ defects/cm³.

5. The synthetic diamond material according to claim 1, wherein the concentration of quantum spin defects in the first surface region is equal to or less than: $4 \times 10^{18}$ defects/cm³.

6. The synthetic diamond material according to claim 1, wherein the quantum spin defects have a Hahn-echo decoherence time $T_2$ equal to or greater than 0.01 ms.

7. The synthetic diamond material according to claim 1, further comprising a plurality of first surface regions.

8. The synthetic diamond material according to claim 1, wherein the surface further comprises a third surface region, the third surface region comprising boron.

9. The synthetic diamond material according to claim 1, wherein the second surface region surrounds the first surface region.

10. A method of fabricating the synthetic diamond material as claimed in claim 1, the method comprising:
 providing a synthetic diamond substrate having a front surface;
 using a chemical vapour deposition process to grow further diamond material over the front surface of the single crystal diamond substrate;
 processing the front surface of the synthetic diamond substrate to form a sensing surface having a first surface region of further diamond material adjacent to a second surface region of diamond substrate material, wherein a quantum spin defect concentration of the further diamond material is at least ten times greater than a quantum spin defect of the synthetic diamond substrate material, and wherein a depth of the first region below the planar front surface is between 100 nm and 100 μm.

11. The method according to claim 10, comprising:
 forming at least one depression in the front surface of the diamond substrate;
 growing the further diamond material in the depression;
 processing the further diamond material to form the sensing surface.

12. The method according to claim 10, comprising:
 locating a mask having at least one opening over the front surface;
 growing the further diamond material over the mask such that further diamond material is grown in a selected area over the front surface;
 removing the mask;
 growing second further diamond material over the front surface; and
 processing back the second further diamond material over the front surface of the synthetic diamond substrate to form the sensing surface.

13. The method according to claim 10, wherein the quantum spin defects are selected from any of:
 negatively charged nitrogen-vacancy defects, NV⁻;
 silicon containing defects;
 nickel containing defects;
 chromium containing defects;
 germanium containing defects;
 tin containing defects; and
 nitrogen containing defects.

14. A microfluidic cell comprising:
 a microfluidic channel for receiving a fluid sample; and
 a sensor located adjacent the microfluidic channel;
 wherein the sensor comprises the synthetic diamond material according to claim 1.

15. A magnetometry sensing probe comprising the synthetic diamond material according to claim 1.

* * * * *